United States Patent
Werker et al.

(10) Patent No.: US 11,852,695 B2
(45) Date of Patent: Dec. 26, 2023

(54) ARRANGEMENT AND PROCESS FOR MONITORING AN ELECTRICAL SAFETY INTERLOCK

(71) Applicant: Hanon Systems, Daejeon (KR)

(72) Inventors: Stephan Werker, Merzenich-Golzheim (DE); Rene Sander, Kerpen (DE); Stefan Tydecks, Cologne (DE)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 17/596,645

(22) PCT Filed: Oct. 8, 2020

(86) PCT No.: PCT/KR2020/013771
§ 371 (c)(1),
(2) Date: Dec. 15, 2021

(87) PCT Pub. No.: WO2021/080221
PCT Pub. Date: Apr. 29, 2021

(65) Prior Publication Data
US 2022/0342004 A1      Oct. 27, 2022

(30) Foreign Application Priority Data

Oct. 22, 2019   (DE) ................... 10 2019 128 441.4

(51) Int. Cl.
*G01R 31/69*   (2020.01)
*G01R 31/00*   (2006.01)
*B60L 3/12*    (2006.01)

(52) U.S. Cl.
CPC .......... *G01R 31/69* (2020.01); *G01R 31/006* (2013.01); *B60L 3/12* (2013.01)

(58) Field of Classification Search
CPC ...... G01R 31/69; G01R 31/006; G01R 31/66; G01R 31/52; G01R 31/68; B60L 3/12;
(Continued)

(56) References Cited

U.S. PATENT DOCUMENTS

| | | | | |
|---|---|---|---|---|
| 10,274,532 | B1* | 4/2019 | Smith | ..... B60R 16/03 |
| 2018/0105125 | A1* | 4/2018 | Gabriel | ..... B60R 16/0232 |
| 2022/0043045 | A1* | 2/2022 | Edelhauser | ..... B60L 3/04 |

FOREIGN PATENT DOCUMENTS

| | | |
|---|---|---|
| CN | 105313700 A | 2/2016 |
| CN | 109541494   | 3/2019 |

(Continued)

*Primary Examiner* — Akm Zakaria
(74) *Attorney, Agent, or Firm* — Shumaker, Loop & Kendrick, LLP; James D. Miller

(57) ABSTRACT

An arrangement and a process for monitoring an electrical safety interlock, based on the task of providing a solution with which affordable and robust monitoring in a safety interlock is facilitated and the overall complexity of the circuitry is reduced. This task is resolved on the arrangement side by the separate circuit being connected to a signal generation and evaluation unit that generates a continuous and value-discrete signal. On the process side, the task is resolved by the monitoring of the circuit being performed using a continuous and value-discrete signal, which is provided by a signal generation and evaluation unit and whose transfer via the circuit is evaluated by the signal generation and evaluation unit.

9 Claims, 3 Drawing Sheets

(58) Field of Classification Search
CPC ........ B60L 3/04; B60L 3/0046; B60L 3/0092;
B60L 53/16; Y02T 10/70; Y02T 10/7072;
Y02T 90/14; B60R 16/03; B60Y 2200/91
See application file for complete search history.

(56) References Cited

FOREIGN PATENT DOCUMENTS

| | | |
|---|---|---|
| CN | 109541494 A | 3/2019 |
| CN | 209290171 U | 8/2019 |
| JP | 2009077627 A | 4/2009 |
| JP | 2019051790 A | 4/2019 |

\* cited by examiner

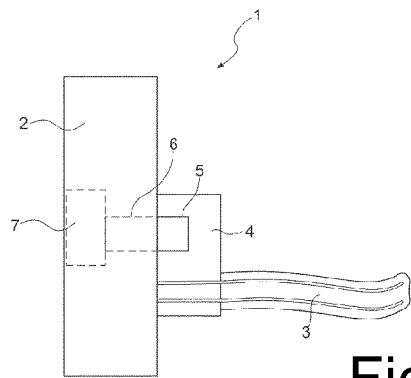

Fig. 1 Prior Art

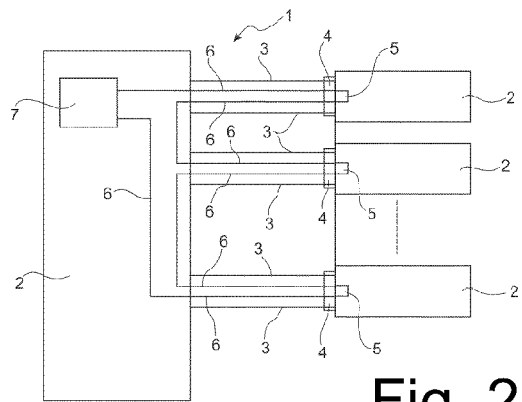

Fig. 2 Prior Art

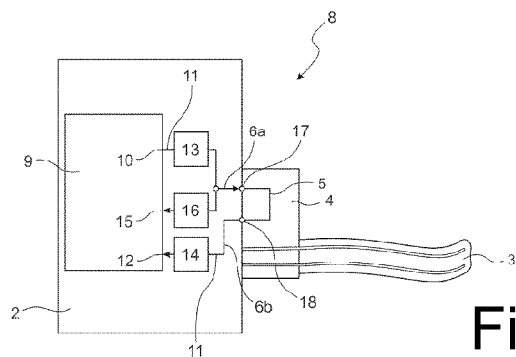

Fig. 3

| Signal generation and evaluation unit | Separate circuit 6 | Second signal input 15 | First signal input 12 |
|---|---|---|---|
| Signal 11 active / evaluation active | Closed | Bit pattern 11 | Bit pattern 11 |
| Signal 11 active / evaluation active | Open | Bit pattern 11 | High level |
| Signal 11 active / evaluation active | Short circuit to earth potential | Low level | Low level |
| Signal 11 active / evaluation active | Short circuit 12 V | High level | High level |

Fig. 4

ARRANGEMENT AND PROCESS FOR MONITORING AN ELECTRICAL SAFETY INTERLOCK

CROSS-REFERENCE TO RELATED PATENT APPLICATIONS

This patent application is a United States nation phase patent application based on PCT/KR2020/013771 filed on Oct. 8, 2020, which claims the benefit of German Patent Application No. 10 2019 128 441.4 filed on Oct. 22, 2019, the entire disclosures of which are hereby incorporated herein by reference.

TECHNICAL FIELD

The invention relates to an arrangement for monitoring an electrical safety interlock, comprising a connector with a high-voltage electrical line, wherein an interlock bridge is arranged in the connector that is connected to a first section of a separate circuit and a second section of a separate circuit for cases in which the connector is connected properly to a high-voltage component.

The invention also relates to a process for monitoring an electrical safety interlock, in which monitoring of a circuit of the safety interlock is performed, wherein the circuit is provided with a first section of a separate circuit and a second section of a separate circuit, as well as an interlock bridge that is arranged in a connector.

In particular, the present invention relates to electrical safety interlocks that are used in vehicles in which DC voltages of 60V or above are used for operating electrical assemblies. This is, for example, the case with inverters used in vehicles that are, for example, required in order to convert a DC voltage into an AC voltage.

The invention also relates to safety interlocks that are used in electrically-powered vehicles or vehicles with so-called hybrid drive.

BACKGROUND ART

When inverters are used to drive electric motors at a high voltage, in particular in vehicles with on-board voltages in excess of 60V, these are often also referred to as high-voltage (HV) applications in the motor vehicle sector. An inverter for an electrically driven refrigerant compressor in a vehicle is one example of a high-voltage application or high-voltage component of this kind.

In this case, the inverter as a high-voltage component provides, for example from a DC voltage equal to or greater than 60V, the AC voltage required in order to operate the electric motor of the refrigerant compressor, which can also comprise multiple phases.

Safety interlocks are, for example, used in electrically-powered vehicles with high-voltage applications (>60 VDC). The task of a safety interlock of this kind lies in monitoring the operating state of a high-voltage circuit, to which the high-voltage components are connected and, in particular, in checking whether all connectors or plug-in connections of a high-voltage circuit of this kind have been inserted/connected securely.

Secure connection of the connectors or plug-in connections is, for example, checked in a high-voltage circuit of an electric refrigerant compressor before the high voltage (>60 VDC) may be applied. A check of this kind can be performed both for a single connector or plug-in connection and for multiple connectors or plug-in connections.

Multiple solutions for safety interlocks of this kind are known from the state of the art.

One version of a safety interlock of this kind as per the state of the art envisages using an interlock bridge in a connector or plug-in connection, via which the high voltage is supplied to the high-voltage component.

When a connector or plug-in connection is connected properly, a separate circuit is closed using an interlock bridge of this kind. This closing of the separate circuit provided for monitoring purposes, which is isolated or electrically insulated from the high-voltage circuit, is detected using a suitable evaluation unit of the safety interlock and the high voltage is then applied.

An evaluation unit of this kind for detection of a securely closed high-voltage circuit by monitoring a separate circuit is, for example, arranged in electronic assemblies of a vehicle, i.e. vehicle electronics.

In a different version of a safety interlock of this kind as per the state of the art, a check of this kind of a separate circuit provided for monitoring purposes extends across multiple connectors or plug-in connectors, each of which exhibits a corresponding interlock bridge. Only for cases in which the separate circuit (interlock loop) that extends across all interlock bridges of all connectors or plug-in connectors is closed is a high voltage applied to a corresponding high-voltage component, such as an inverter.

One disadvantage of this state of the art lies in the fact that short circuits can occur in one of the connectors/plug-in connectors or in the separate circuit used for monitoring purposes, wherein the evaluation unit can interpret a state of this kind as a properly closed connection.

To avoid an incorrect detection of this kind, further processes are known from the state of the art that target avoidance of incorrect detection or monitoring of a high-voltage circuit.

An electrical energy source for a motor vehicle is known from U.S. Pat. No. 7,557,460 B2. The task focuses on an interlocking circuit detecting a disconnected state of an interlocking wire and, where necessary, deactivating a contactor in order to achieve safety when applying an operating voltage.

It is therefore envisaged that an interlocking circuit encompasses a current output circuit, which outputs a detectable current via a diode to the interlocking wire. A first current detection sub-circuit, which is connected to the current output circuit via the interlocking wire and the diode, a second current detection sub-circuit, which is connected to a connection point that is arranged operatively between the current output circuit and the diode, and an evaluation circuit are also envisaged.

If the detectable current is detected in the second current detection sub-circuit and not in the first current detection sub-circuit of the interlocking circuit, the evaluation circuit determines that the interlocking wire is in a disconnected state and therefore deactivates the contactor, thereby interrupting application of a high voltage.

A switching device and a process for determining a state of an interlock loop are described in U.S. Pat. No. 10,139, 443 B2. The task to be resolved lies in achieving reliable protection for persons and animals from the hazards associated with the high-voltage components in a vehicle.

In order resolve the task, it is envisaged that a switching device is provided for determining a state of an electrical interlock conductor loop, in particular a touch protection circuit of a vehicle, specifically of a hybrid or all-electric vehicle, wherein the interlock conductor loop is itself set up for monitoring at least one high-voltage component of the vehicle.

However, these known solutions for improving the function of a safety interlock suffer from the disadvantage that they require a complex circuit arrangement, in particular for measuring the analogue variables, which increases their manufacturing costs. In the system according to U.S. Pat. No. 7,557,460 B2, two current detection sub-circuits are even required.

In addition, analogue variables with low amplitudes, such as voltages and/or currents, also need to be measured in safety interlocks of this kind. Due to the low amplitudes of the variables, however, measurements of this kind are highly sensitive to interference, which limits their functionality and ruggedness.

In the event of a fault, it is also not possible to produce diagnostics as to which fault has occurred and in which section.

There is therefore a need for an improved arrangement and an improved process for monitoring an electrical safety interlock, in particular in a vehicle.

SUMMARY

The object of the invention lies in providing an arrangement and a process for monitoring an electrical safety interlock, with which affordable and robust monitoring is facilitated in a safety interlock and the overall complexity of the circuitry is reduced.

The task is resolved by a subject matter that exhibits the characteristics as shown and described herein.

The task is also resolved by a process that exhibits the characteristics as shown and described herein.

For monitoring secure functioning of high-voltage circuits in vehicles, it is envisaged that connectors or plug-in connections such as those known from the state of the art are provided with interlock bridges.

It is also envisaged that a suitable arrangement is used to generate a signal with a signal level that changes in a defined way over time and is transferred via the lines arranged for the separate circuit and, in particular, the interlock bridges of the connectors or plug-in connections. A signal of this kind can, for example, be an easy-to-generate bit pattern. Alternative signals with more than two switching states can also be used.

A microcontroller or microprocessor can, for example, be used as an arrangement of this kind for generating a bit pattern, for example a digital bit pattern. Many assemblies, such as a high-voltage component of an inverter for a refrigerant compressor, are equipped with intelligent control and regulation units, such as a microcontroller, for example in order to control and regulate the operating mode of the high-voltage component itself. A microcontroller of this kind, already present in the high-voltage component, can therefore be used to generate a signal such as a digital bit pattern without accruing any additional circuitry-related costs.

For monitoring an inserted connector of a high-voltage component in a high-voltage circuit, it is envisaged to provide the signal generated by the arrangement for generating a (digital) bit pattern directly at a second signal input of an evaluation unit. Following its transfer via the separate circuit, it is also envisaged to provide the signal generated by the arrangement for generating a digital bit pattern at a first signal input of an evaluation unit.

The evaluation unit can then determine, by performing a signal comparison of the signal at the first signal input and the signal at the second signal input, whether the connector of the high-voltage component has been inserted correctly. If this is the case, as indicated by the signals both being the same, the evaluation unit will generate and send out a signal to enable the high voltage for the high-voltage component, which is then applied.

It is also envisaged to provide the arrangement for generating a digital bit pattern and the evaluation unit in a single unit as a signal generation and evaluation unit, such as a microprocessor.

For matching to an on-board system already present in a vehicle, for example with an on-board voltage of 12V, it is envisaged to perform an adjustment of signal levels. An adjustment of this kind to signal levels is performed between the anticipated signal level, which is provided by the signal generation and evaluation unit, and a higher signal level for transfer via the separate circuit and the interlock bridges in the vehicle's on-board voltage system.

Another advantage of performing an adjustment of this kind to signal levels lies in the associated increase in interference immunity. In addition, the associated costs are, for example, reduced for a 5V voltage generating unit, which is used both to supply assemblies for controlling a corresponding high-voltage component and to supply the microprocessor as the signal generation and evaluation unit.

Multiple level converters are used to adjust the signal level, for example adjusting a signal level from 5V to a signal level of 12V or vice versa.

Comparing the signal transferred at the second signal input with the signal received at the first signal input of the signal generation and evaluation unit provides two benefits. Firstly, it makes it possible to detect whether the connector of the high-voltage component is inserted correctly. Secondly, it also allows states such as a short circuit to earth (GND) or an operating voltage to be detected by the signal generation and evaluation unit. Corresponding signals are then generated and output by the signal generation and evaluation unit based on the state detected.

These signals or states of the safety interlock, generated by the signal generation and evaluation unit, are transferred, for example to a central control unit, via a databus present in a vehicle and then processed accordingly in the control unit.

BRIEF DESCRIPTION OF DRAWINGS

Further details, features and benefits of embodiments of the invention result from the following description of embodiment examples with reference to the accompanying drawings. These display the following:

FIG. 1: A state-of-the-art safety interlock.

FIG. 2: A state-of-the-art safety interlock with multiple high-voltage components.

FIG. 3: A safety interlock according to the invention.

FIG. 4: An overview of states that can be detected by the safety interlock according to the invention.

DETAILED DESCRIPTION OF AN EMBODIMENT

Figure 5:
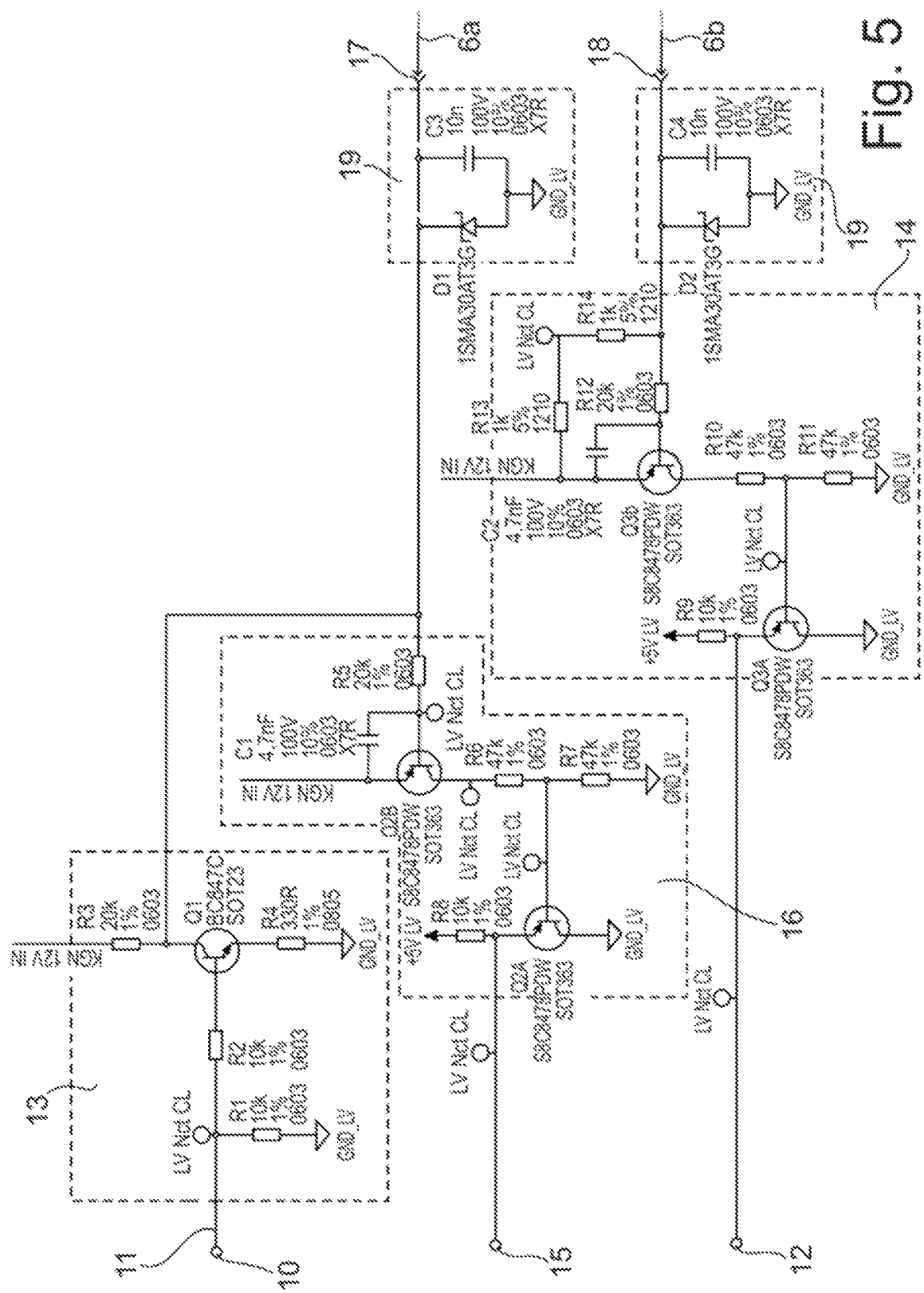
FIG. 5: An example of a circuit arrangement for the level converters of the safety interlock according to the invention.

FIG. 1 shows an arrangement 1 for monitoring a state-of-the-art safety interlock. The high-voltage component 2 from FIG. 1 which is to be supplied with a high voltage (>60 VDC) is, for example, an inverter 2 of a refrigerant compressor, which is not shown in greater detail in FIG. 1.

A high-voltage electrical line 3 of a high-voltage circuit is connected to the inverter 2 using a connector 4 for supplying the high voltage.

The connector 4 is equipped with the interlock bridge 5 known from the state of the art, via which the secure connection of the connector 4 to a corresponding socket in the inverter 2 can be checked using a separate circuit 6, which is only implied in FIG. 1.

An evaluation unit 7, which is arranged in the inverter 2 and only symbolically depicted in FIG. 1, is, for example, provided in order to perform this check.

To check a secure connection of the high-voltage electrical line 3 using the connector 4 on the inverter 2, it is envisaged to allow a current to flow over the interlock bridge 5 that is then detected by the evaluation unit 7 arranged in the inverter 2.

As already explained above, this solution is only partially secure and offers only limited robustness. As such, no reliable monitoring of an electrical safety interlock in a vehicle can be achieved.

FIG. 2 shows an arrangement 1 for monitoring a state-of-the-art safety interlock with multiple high-voltage components 2.

To check a secure connection of the high-voltage electrical line 3 on the respective high-voltage component 2 using the respective connector 4, it is envisaged to allow a current to flow over the separate circuit 6 and the interlock bridges 5. Secure attachment of the connectors 4 is detected using the evaluation unit 7, which is also arranged in the separate circuit 6 and facilitates the flow of current.

If the results of this detection are OK, the high voltage is applied via the high-voltage electrical lines 3 for all high-voltage components 2. This implementation therefore facilitates monitoring of a secure connection of the connectors 4 on multiple high-voltage components 2 at the same time. However, the disadvantages known from the state of the art also apply to this implementation.

FIG. 3 shows an arrangement according to the invention 8 for monitoring a safety interlock. A signal generation and evaluation unit 9, which for example controls operation of the inverter 2, is arranged in a high-voltage component 2, such as an inverter 2. This signal generation and evaluation unit 9, which is intended to be a microprocessor 9 in the example, exhibits an output 10 for outputting a digital signal 11.

This signal 11 is a signal with a signal level that changes over time. A bit pattern 11 can, for example, be generated by the signal generation and evaluation unit 9 as a signal of this kind.

The signal 11 can be a binary signal that exhibits just two voltage levels. However, restricting the signal 11 to just two voltage levels is not envisaged. The signal 11 can alternatively also be any other value-discrete and continuous signal.

The signal 11, such as a bit pattern 11, can be generated both according to the random chance principle and based on fixed stipulations. The bit pattern 11, with a sample sequence of zeros and ones, is output via the output 10.

This bit pattern 11 is transferred via a first section of the separate circuit 6a to the interlock bridge 5 in a connector 4. From the interlock bridge 5 of the connector 4, the bit pattern 11 makes its way via a second section of the separate circuit 6b back to the signal generation and evaluation unit 9 and to a first signal input 12.

It is envisaged to perform an adjustment to the signal level of the signal 11 and thereby improve the interference resistance during detection of a secure attachment of the connectors 4 with the high-voltage electrical line 3 on a high-voltage component 2. In order to perform an adjustment of this kind to the signal level, a first level converter 13 is arranged directly at the output 10 of the signal generation and evaluation unit 9 which, for example, increases a signal 11 exhibiting a signal level of 5V to a signal level of 12V at the output 10 which is then transferred via the sections 6a and 6b of the separate circuit 6 and interlock bridge 5. In this case, a second level converter 14 is arranged directly before the first signal input 12 and converts the signal 11 being received from the second part of the separate circuit 6b at a level of 12V into a signal 11 with a level of 5V, which is then fed to the first signal input 12.

The signal 11 generated by the signal generation and evaluation unit 9 is also fed to a second signal input 15 of the signal generation and evaluation unit 9.

For cases in which the signal level has been raised to a signal level of 12V by a first level converter 13, a third level converter 16 is arranged before the second signal input 15 and adjusts the signal level of the signal 11 to the level of the second signal input 15. In the example, an adjustment of the level from 12V to 5V is performed using the third level converter 16. In this example, a signal generation and evaluation unit 9 is used which supplies a voltage of up to 5V at its outputs, such as the output 10, and can process signals with a voltage of up to 5V at is inputs, such as the first signal input 12 and the second signal input 15. Different voltages are, of course, possible when using a different signal generation and evaluation unit 9.

The signal generation and evaluation unit 9 which generates the signal 11 receives the generated signal 11 via the second signal input 15 directly in the form in which it was provided at the output 10.

The signal generation and evaluation unit 9 also receives the signal 11 after the signal 11 has been transferred via the sections 6a and 6b of the separate circuit 6 and the interlock bridge 5. For cases in which the connector 4 has been inserted properly, the signal generation and evaluation unit 9 determines, during a comparison of the signals at the first signal input 12 and the second signal input 15, that these two signals match, at least in terms of their bit pattern. A difference in the amplitude or level of the signals is possible and does not influence the secure comparison.

When the signals match in this way, the connector 4 on the high-voltage component 2 has been inserted properly and the signal generation and evaluation unit 9 can generate and output a signal for enabling the high voltage via the high-voltage electrical line 3. This then activates the high voltage.

For cases in which the connector 4 has not been inserted properly, meaning that the separate circuit 6 cannot be connected to the sections 6a and 6b using the interlock bridge 5, the signal generation and evaluation unit 9 determines, when performing a comparison of the signals at the first signal input 12 and second signal input 15, that these do not match. In this case, no signal to enable the high voltage via the high-voltage electrical line 3 is generated or output, meaning that the high voltage is also not activated. In this case, a corresponding fault signal can be generated and output by the signal generation and evaluation unit 9.

FIG. 4 shows an overview of states that can be detected by the safety interlock according to the invention.

The first column shows that the signal 11 is provided continuously by the signal generation and evaluation unit 9 and that the evaluation, i.e. the comparison between the signals at the first signal input 12 and the second signal input 15, is performed.

Possible states of the separate circuit 6 with the sections 6a and 6b are shown with the interlock bridge 5 in the second column. The third column lists the accompanying states of the second signal input 15, while the fourth column lists the accompanying states of the first signal input 12.

A proper connection of the connector 4 to the high-voltage component 2 is shown in the first line of the table from FIG. 4. The signal 11, which is supplied continuously by the signal generation and evaluation unit 9, is then received as a bit pattern via both the second signal input 15 and the first signal input 12. When the two signals match, a signal (not shown in the figures) for activating the high voltage via the high-voltage electrical line 3 is generated and output by the signal generation and evaluation unit 9.

In the second line, the connector 4 has not been connected to the high-voltage component 2 properly. The bit pattern 11 generated by the signal generation and evaluation unit 9 is therefore received at the second signal input 15. The first signal input 12 is open and does not receive the bit pattern 11. This open first signal input 12 leads to detection of a high level. The fact that these signals do not match is detected by the signal generation and evaluation unit 9 and the signal for enabling the high voltage is not issued. In this condition, a fault signal that indicates an open plug-in connection of the connector 4 can be issued by the signal generation and evaluation unit 9.

The third line shows a fault state, in which a section of the separate circuit 6a or 6b or the interlock bridge 5 exhibits a connection to earth potential. In this case, a low level is detected at both the second signal input 15 and the first signal input 12, and no signal to enable the high voltage is provided. A fault signal that indicates a short circuit to earth potential can be issued by the signal generation and evaluation unit 9 here.

The fourth line shows a fault state, in which a section of the separate circuit 6a or 6b or the interlock bridge 5 exhibits a connection to a voltage, for example 12V, such as an operating voltage in a vehicle. In this case, a high level is detected at both the second signal input 15 and the first signal input 12, and no signal to enable the high voltage is issued. A fault signal that indicates a short to a 12V operating voltage can be issued by the signal generation and evaluation unit 9 here.

The level converters 13, 14 and 16 are designed with corresponding protective circuits, so that they can continue to operate properly in the event of a continuous input signal, for example of 0V or 12V.

FIG. 5 shows an example of a circuit arrangement for the level converters 13, 14 and 16 of the arrangement 8 according to the invention for monitoring a safety interlock according to the embodiment of the invention shown in FIG. 3 (see FIG. 3). This implementation of the first level converter 13, of the second level converter 14 and of the third level converter 16 is both illustrative and robust, although it does not restrict the present invention to only this version.

The signal 11 with a level of 5V, generated by the signal generation and evaluation unit 9 and supplied via the output 10, is converted by the first level converter 13, which encompasses a transistor stage, to a level such as 12V (example) and then output via a first connection 17. The section 6a of the separate circuit 6 is, for example, connected to this first connection 17, as implied in FIG. 5.

This level, present at the first connection 17 and for example measuring 12V, is fed directly to a third level converter 16, which encompasses two transistor stages. A level adjustment is once again performed in this third level converter 16 in such a way that the signal 11 is supplied with a level of 5V for the second signal input 15. The level of the signal 11 over time, for example a bit pattern—i.e. a sequence of zeros and ones, is not changed by any of the level converters 13, 14 or 16.

When a connector 4 has been inserted properly, the signal 11 that is output at the first connection 17 is routed via a first section of the separate circuit 6a, via the interlock bridge 5 of the connector 4 and via a second section of the separate circuit 6b to the second connection 18 and thereby to the input of the second level converter 14. This second level converter 14, which encompasses two transistor stages, performs a level adjustment in such a way that the signal 11 is supplied at a level of 5V for the first signal input 12.

The first connection 17 and the second connection 18 are each equipped with a protective circuit 19. These protective circuits 19 implement overvoltage protection and thereby protect voltage-sensitive components of the level converters 13, 14 and 16 from damage caused by high voltage and high-energy balancing processes at the connections 17, 18, as well as the separate circuit 6a, 6b.

The process according to the invention exhibits a high degree of interference immunity through use of the signal 11 and facilitates secure detection of the properly inserted connector 4 into a corresponding socket of a high-voltage component 2 by performing a basic comparison of two signal patterns or bit patterns of the signals 11.

Another advantage lies in the fact that an energy saving can be achieved by using a corresponding design of the signal 11. A permanent flow of current over the first and the second section of the separate circuit 6a and 6b is no longer necessary and a further energy saving can be achieved thanks to a reduction of the ones in the bit pattern 11, which are characterised by a high level of the signal 11. For example, two pulses within a signal pattern that repeats itself in the signal 11 would be sufficient for secure detection of the condition of the connector 4. A bit pattern 11 of this kind also reduces the thermal stress within the accompanying electronics.

Since a short circuit to an earth potential (GND) or an operating voltage leads to a signal that differs from a bit pattern 11, it is also possible to detect faults of this kind using the invention.

As described in the example, detection of the properly inserted connector 4 into a corresponding socket of a high-voltage component 2 is implemented by a signal generation and evaluation unit 9, which is arranged directly in the high-voltage component 2. Monitoring by a separate control logic, to be arranged in the vehicle, can then be omitted.

It is also envisaged that the states detected by the signal generation and evaluation unit 9 are to be transferred, via a vehicle communication bus already present in the vehicle, to a central control unit. The states of each high-voltage component 2 are therefore reported to the central control unit. Standard systems, such as a LIN bus (Local Interconnect Network) or a CAN bus (Controller Area Network), can be used as a vehicle communication bus of this kind.

Figure 6:
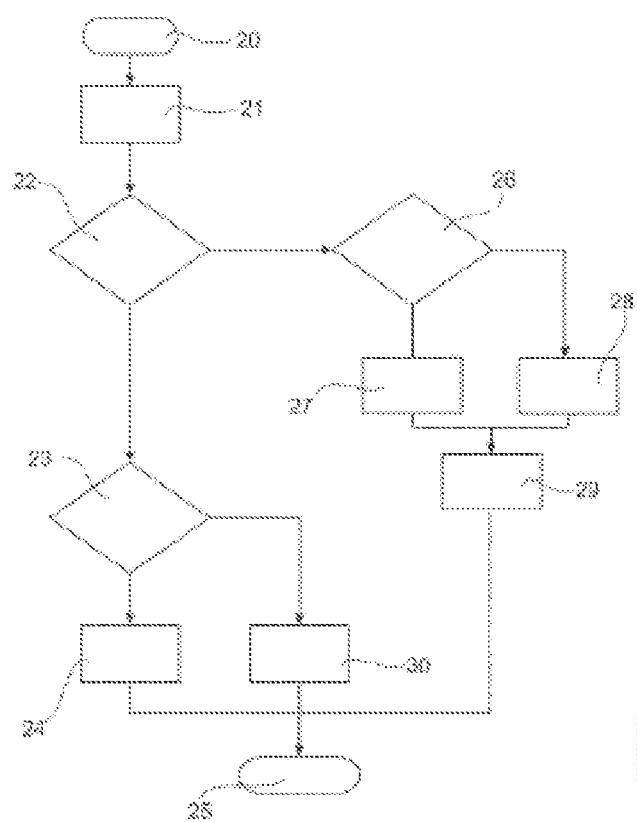
FIG. 6: A flowchart that depicts the process for monitoring an electrical safety interlock.

FIG. 6 shows a flowchart that depicts the process for monitoring an electrical safety interlock, wherein the reference numbers stated in the following text in the range from 1 to 19 from FIGS. 1 to 5 are not shown in FIG. 6. The process starts in step 20. In step 21, a signal generation and evaluation unit 9, which can be a microprocessor, is used to generate a signal that changes over time, which is for example a bit pattern 11 and is output via the output 10.

Following on from this, in step 22 a first check is performed to determine whether the bit pattern 11 is being received by the first signal input 12 of the signal generation and evaluation unit 9. This check delivers a positive result for cases in which the bit pattern 11 is, for example, transferred from output 10 via the first section 6a of the separate circuit, the interlock bridge 5 and the second section 6b of the separate circuit to the first signal input 12. Here, it is also possible for this transfer to take place via a first level converter 13 and a third level converter 16 and/or for the bit pattern 11 to be received with its signal level inverted.

In the event of a positive result of this first check 22, the process is continued in step 23 with a second check of the receipt of the bit pattern 11 at the second signal input 15 and a comparison of the bit patterns 11 received at the inputs 12 and 15.

If the two bit patterns 11 match, a properly established connection of the connector 4 is detected and a corresponding positive signal, such as "Plug-in connection established", is generated and output by the signal generation and evaluation unit 9 in step 24. The process then ends with step 25.

For cases in which no match of the bit patterns 11 is determined during the second check in step 23, no properly established connection of the connector 4 is detected and a corresponding negative signal, such as "Plug-in connection open", is generated and output by the signal generation and evaluation unit 9 in step 30. The process also ends with step 25 in this case.

For cases in which it is determined during the first check in step 22 that the bit pattern 11 is not being received by the first signal input 12 of the signal generation and evaluation unit 9, the process is continued in step 26 with a check of the voltage level at the first signal input 12.

If a high level of the signal, for example in the region of an operating voltage of 12V, is determined during this check 26, the first state 27 is detected, which indicates a short circuit to the operating voltage.

If a low level of the signal, for example in the region of earth (GND), is determined during this check 26, the state 27 is detected, which indicates a short circuit to earth (GND).

In both cases, at least one fault signal is issued in the subsequent step 29 before the process is concluded in step 25. Alongside output of the fault signal, the corresponding first state 27 or second state 28 can also be output in step 29.

The invention relates to an arrangement for monitoring an electrical safety interlock, comprising a connector with a high-voltage electrical line, wherein an interlock bridge is arranged in the connector that is connected to a first section of a separate circuit and a second section of a separate circuit for cases in which the connector is connected properly to a high-voltage component.

The invention also relates to a process for monitoring an electrical safety interlock, in which monitoring of a circuit of the safety interlock is performed, wherein the circuit is provided with a first section of a separate circuit and a second section of a separate circuit, as well as an interlock bridge that is arranged in a connector.

In particular, the present invention relates to electrical safety interlocks that are used in vehicles in which DC voltages of 60V or above are used for operating electrical assemblies. This is, for example, the case with inverters used in vehicles that are, for example, required in order to convert a DC voltage into an AC voltage.

The invention also relates to safety interlocks that are used in electrically-powered vehicles or vehicles with so-called hybrid drive.

The invention claimed is:

1. An arrangement for monitoring an electrical safety interlock, the arrangement comprising:
a connector with a high-voltage electrical line, wherein the connector houses a jumper that is connected to a first section of a separate circuit and a second section of the separate circuit when the connector is connected to a high-voltage component, wherein the first and the second sections of the separate circuit are connected to a signal generation and evaluation unit that generates a continuous and value-discrete signal, wherein the signal generation and evaluation unit exhibits an output for outputting the signal, wherein the output is connected at least indirectly to the first section of the separate circuit, and wherein the second section of the separate circuit is connected at least indirectly to a first signal input and that the output is connected at least indirectly to a second signal input, wherein the signal provided by the signal generation and evaluation unit and output via the output is received by the signal generation and evaluation unit in a first channel via the second signal input without passing through the jumper, wherein the signal is received by the signal generation and evaluation unit via the first signal input in a second channel following transfer via the first section of the separate circuit, the jumper and the second section of the separate circuit, and wherein the monitoring of the electrical safety interlock is performed by the signal generation and evaluation unit through a comparison of the signal received via the first signal input in the second channel with the signal received via the second signal input in the first channel.

2. An arrangement for monitoring an electrical safety interlock, the arrangement comprising:
a connector with a high-voltage electrical line, wherein the connector houses a jumper that is connected to a first section of a separate circuit and a second section of the separate circuit when the connector is connected to a high-voltage component, wherein the first and the second sections of the separate circuit are connected to a signal generation and evaluation unit that generates a continuous and value-discrete signal, wherein the signal generation and evaluation unit exhibits an output for outputting the signal, wherein the output is connected at least indirectly to the first section of the first separate circuit, and wherein the second section of the separate circuit is connected at least indirectly to a first signal input and that the output is connected at least indirectly to a second signal input, wherein a first level converter is arranged between the output and the first section of the separate circuit, wherein a third level converter is arranged between the second signal input and the first section of the separate circuit, and wherein a second level converter is arranged between the first signal input and the second section of the separate circuit.

3. The arrangement for monitoring the electrical safety interlock according to claim 1, wherein a first level converter is arranged between the output and the first section of the first separate circuit, wherein a third level converter is arranged between the second signal input and the first section of the separate circuit , and wherein a second level converter is arranged between the first signal input and the second section of the separate circuit.

4. The arrangement for monitoring the electrical safety interlock according to claim 1, wherein the signal generation and evaluation unit is a microprocessor.

5. A process for monitoring an electrical safety interlock, the process comprising:

monitoring of a circuit of the safety interlock, wherein the circuit is provided with a first section of a first separate circuit and the section of a second separate circuit, as well as a jumper arranged in a connector, wherein the monitoring of the circuit is performed using a continuous and value-discrete signal that is provided by a signal generation and evaluation unit and transfer of the signal via the circuit is evaluated by the signal generation and evaluation unit, wherein the signal provided by the signal generation and evaluation unit and output via an output is received by the signal generation and evaluation unit in a first channel via a second signal input without passing through the jumper, wherein the signal is received by the signal generation and evaluation unit via a first signal input in a second channel following transfer via the first section of the separate circuit, the jumper and the second section of the separate circuit, and wherein the monitoring of the electrical safety interlock is performed by the signal generation and evaluation unit through a comparison of the signal received via the first signal input in the second channel with the signal received via the second signal input in the first channel.

6. The process for monitoring the electrical safety interlock according to claim 5, wherein the signal is transferred on the second channel via the first section of the separate circuit, the jumper and the second section of the separate circuit.

7. The process for monitoring the electrical safety interlock according to claim 6, wherein a signal is output by the signal generation and evaluation unit that indicates secure functioning of the safety interlock when the signal received via the first signal input in the second channel with the signal received via the second signal input in the first channel are found to match one another when performing the comparison of the signals and that a signal which indicates a malfunction of the safety interlock is output by the signal generation and evaluation unit when no match or only a partial match is determined when comparing the signal received via the first signal input in the second channel with the signal received via the second signal input in the first channel.

8. The process for monitoring the electrical safety interlock according to claim 5, wherein the signal is a binary bit pattern.

9. The process for monitoring the electrical safety interlock according to claim 5, wherein a level of the signal is altered prior to transfer via the first and the second sections of the separate circuit and following transfer via the first and the second sections of the separate circuit.

* * * * *